(12) United States Patent
Mimotogi et al.

(10) Patent No.: US 7,229,721 B2
(45) Date of Patent: *Jun. 12, 2007

(54) METHOD FOR EVALUATING PHOTO MASK AND METHOD FOR MANUFACTURING SEMICONDUCTOR DEVICE

(75) Inventors: Shoji Mimotogi, Yokohama (JP); Shigeki Nojima, Yokohama (JP); Osamu Ikenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 570 days.

This patent is subject to a terminal disclaimer.

(21) Appl. No.: 10/705,954

(22) Filed: Nov. 13, 2003

(65) Prior Publication Data

US 2004/0137340 A1 Jul. 15, 2004

(30) Foreign Application Priority Data

Nov. 14, 2002 (JP) ............................. 2002-331051

(51) Int. Cl.
*G03F 1/00* (2006.01)
(52) U.S. Cl. ......................................................... 430/5
(58) Field of Classification Search .................... 430/5, 430/30, 394; 716/19–21
See application file for complete search history.

(56) References Cited

U.S. PATENT DOCUMENTS 6,208,469 B1 * 3/2001 Matsuura .................... 359/637

7,001,697 B2 * 2/2006 Park et al. ..................... 430/5
7,008,731 B2 * 3/2006 Nojima et al. ................ 430/5

FOREIGN PATENT DOCUMENTS

| JP | 2002-260285 | 9/2002 |
|---|---|---|
| JP | 2002-351048 | 12/2002 |

\* cited by examiner

*Primary Examiner*—S. Rosasco
(74) *Attorney, Agent, or Firm*—Finnegan, Henderson, Farabow, Garrett & Dunner, L.L.P.

(57) ABSTRACT

A method for evaluating a photo mask comprises preparing a photo mask including a unit drawing pattern, finding a dimensional variation relating to the photo mask, the dimensional variation including first and second dimensional variations, the first dimensional variation occurring due to a positional displacement and size mismatch of the unit drawing pattern in the photo mask and the second dimensional variation occurring due to etching and development relating to a manufacturing of the photo mask, estimating a deteriorated amount of an exposure latitude occurring due to the dimensional variation of the photo mask using the dimensional variation and a degree of influence of the dimensional variation for the exposure latitude, and judging quality of the photo mask by comparing the deteriorated amount of the exposure latitude and an allowable deteriorated amount of the exposure latitude.

20 Claims, 3 Drawing Sheets

| σp(nm) | σw(nm) | σE(%) |
|---|---|---|
| 0 | 0 | 0.000 |
| 0 | 1 | 0.245 |
| 0 | 2 | 0.512 |
| 0 | 3 | 0.740 |
| 0 | 4 | 0.978 |
| 1 | 0 | 0.128 |
| 1 | 1 | 0.274 |
| 1 | 2 | 0.478 |
| 1 | 3 | 0.783 |
| 1 | 4 | 0.948 |
| 2 | 0 | 0.264 |
| 2 | 1 | 0.353 |
| 2 | 2 | 0.583 |
| 2 | 3 | 0.782 |
| 2 | 4 | 1.030 |
| 3 | 0 | 0.394 |
| 3 | 1 | 0.477 |
| 3 | 2 | 0.643 |
| 3 | 3 | 0.919 |
| 3 | 4 | 0.993 |
| 4 | 0 | 0.527 |
| 4 | 1 | 0.583 |
| 4 | 2 | 0.705 |
| 4 | 3 | 0.928 |
| 4 | 4 | 1.070 |

FIG. 4

METHOD FOR EVALUATING PHOTO MASK AND METHOD FOR MANUFACTURING SEMICONDUCTOR DEVICE

CROSS-REFERENCE TO RELATED APPLICATIONS

This application is based upon and claims the benefit of priority from the prior Japan Patent Application No. 2002-331051, Nov. 14, 2002, the entire contents of which are incorporated herein by reference.

BACKGROUND OF THE INVENTION

1. Field of the Invention

The present invention relates to a method for evaluating a photo mask for use in a semiconductor process and method for manufacturing a semiconductor device.

2. Description of the Related Art

In recent years, stricter dimensional accuracy of a photo mask has been rapidly required. For example, the dimensional uniformity in the photo mask area is required to be below 10 nm. In the manufacturing process of the photo masks, many more items are checked to decide whether manufactured photo masks are good or failure. If, therefore, even one of these checking items does not satisfy their specification, the manufactured photo mask is rejected as being failure. Under such a stricter accuracy thus sought, a high accuracy manufacturing technique has been progressed, but the manufacturing yield is becoming poor.

It is necessary to satisfy the specification of the photo mask in order to obtain a desired exposure latitude in a wafer exposure process where the photo mask is used In a conventional photo mask specification it has been determined that, even if respective checking items have their values all reach the limit value of the specification, it is possible to obtain a desired exposure latitude.

There is really a very rare case that all the checking items of a practical photo mask have their values reach the limit values of the specification. There are in reality more cases that, even if some checking items of the photo masks exceed the values of the specification, others fall within the values of the specification with some margin.

Such photo masks are treated as being failure. In this case, however, it is considered that, in them, there exist some photo masks capable of obtaining a desired exposure latitude, that is, some photo masks involving no real problem in their mass production.

The reason is as follows. That is, even in the case where some photo masks have their checking items exceed the specification value while others have their checking items fall within the specification value, if a decreased exposure latitude caused by checking items which exceeds the specification values is made smaller than an increased exposure latitude caused by checking items which fall within the specification value with some margin, then it is possible to obtain a desired exposure latitude as a whole.

By the way, there is JPN PAT APPLN KOKAI PUBLICATION NO. 2002-260285 as the prior art. This prior art shows a dimensional variation of the photo masks and their average value as well as the use of a phase shift mask merely described in connection with the transmittivity and phase difference. However, this is not adequate as to make a decision whether the photomask is good or failure. There is a risk that a good mask will be decided as being failure. This involves a fall in manufacturing yield of photo masks, thus presenting a problem.

Further, the dimensional variation now under consideration includes a global dimensional variance occurring on a whole area of a photo mask (reticle) and a local dimensional variation occurring at a very small area. Between them, a different influence is exerted on the exposure latitude.

In the conventional photo mask evaluation method, no distinction is given between the global variation and the local variation and the deteriorated amount of the exposure latitude is evaluated with the same extent of influence. In the case where the extent of difference of the local variation exerted on the exposure latitude is smaller (vice versa) than that of the global variation, overestimation is involved on the deteriorated amount of the exposure latitude. Therefore, there is a risk that a good photo mask will be decided as being an failure one. This involves a lower manufacturing yield of photo masks.

BRIEF SUMMARY OF THE INVENTION

In one aspect of the present invention there is provided a method for evaluating a photo mask comprising preparing a photo mask including a unit drawing pattern;

finding a dimensional variation relating to the photo mask, the dimensional variation including first and second dimensional variations, the first dimensional variation occurring due to a positional displacement and size mismatch of the unit drawing pattern in the photo mask and the second dimensional variation occurring due to etching and development relating to a manufacturing of the photo mask;

estimating a deteriorated amount of an exposure latitude occurring due to the dimensional variation of the photo mask using the dimensional variation and a degree of influence of the dimensional variation for the exposure latitude; and judging quality of the photo mask by comparing the deteriorated amount of the exposure latitude and an allowable deteriorated amount of the exposure latitude.

In another aspect of the present invention there is provided a method for manufacturing a semiconductor device comprising selecting a good photo mask by judging quality of a photo mask using a photo mask evaluating method, the photo mask evaluating method comprising preparing a photo mask including a unit drawing pattern; finding a dimensional variation relating to the photo mask, the dimensional variation including first and second dimensional variations, the first dimensional variation occurring due to a positional displacement and size mismatch of the unit drawing pattern in the photo mask and the second dimensional variation occurring due to etching and development relating to a manufacturing of the photo mask; estimating a deteriorated amount of an exposure latitude occurring due to the dimensional variation of the photo mask using the dimensional variation and a degree of influence of the dimensional variation for the exposure latitude; and judging quality of the photo mask by comparing the deteriorated amount of the exposure latitude and an allowable deteriorated amount of the exposure latitude, and performing a photo-lithography process using the selected good photo mask.

BRIEF DESCRIPTION OF THE SEVERAL VIEWS OF THE DRAWING

FIG. 4 is a view showing a relation among σp, σw, σE found by a Monte Carlo simulation.

DETAILED DESCRIPTION OF THE INVENTION

Figure 1:
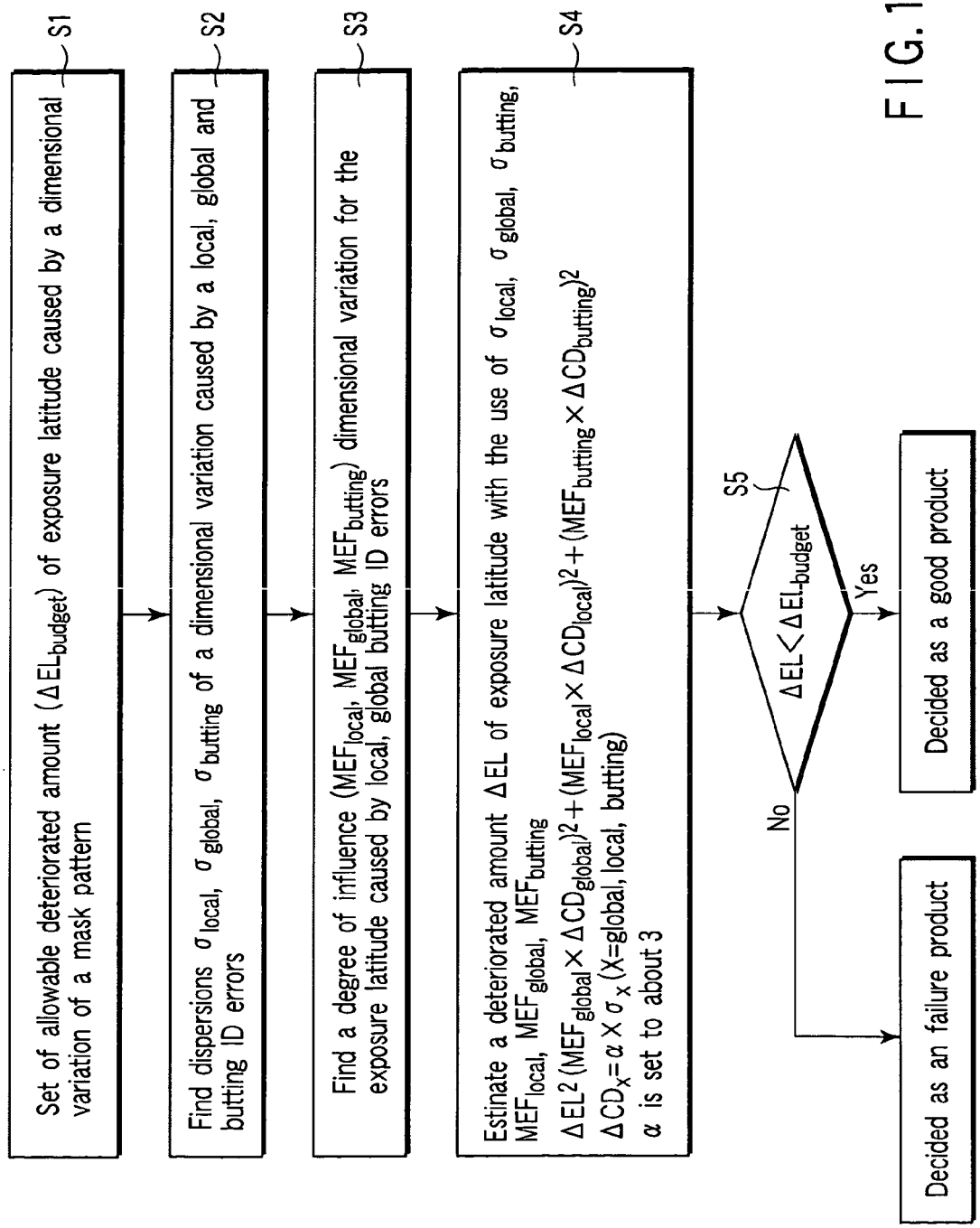
FIG. 1 is a flow chart showing a method for evaluating a photo mask according to an embodiment of the present invention.

The embodiments of the present invention will be described below by referring to the drawing.

(First Embodiment)

FIG. 1 is a flow chart showing a method of the evaluation of photo masks according to the first embodiment of the present invention.

First, a mask blanks is prepared. The mask blanks has a transparent substrate, such as a quartz substrate, and a light shielding film, such as a Cr film, on the transparent substrate.

Then a 130 nm-thick L/S pattern is formed over the mask blanks to provide a photo mask.

A concrete manufacturing method of the photo mask is as will be set out below.

A resist is coated on the mask blanks, an L/S pattern is drawn on the resist film with the use of an electron beam drawing device, and the resultant resist is developed to provide a resist pattern including the L/S pattern. Then the light shielding film is etched by using the resist pattern as a mask, thereafter the resist pattern is removed. By doing so, the photo mask is obtained which includes the L/S pattern. The mask blanks and photo masks are made by the same maker or different makers.

An allowable amount of deteriorated exposure latitude (allowable deteriorated amount of exposure latitude) $\Delta EL_{budget}$ is set. The deteriorated exposure latitude is caused by a dimensional variation of a pattern on the photo mask (mask pattern). Here, $\Delta EL_{budget}$ is set to be equal to 4.0%.

Next, the dimensional variation of the mask pattern (here an L/S pattern) is measured by a dimension measurement equipment. At this time, the dimensional variation of the mask pattern is measured as the following three dimensional variations.

The first dimensional variation corresponds to a dimensional variation caused by the positional displacement and size mismatch of a unit drawing pattern (local CD error) and this is represented by $\Delta CD_{local}$. The $\Delta CD_{local}$ is related to the above-mentioned unit drawing pattern (unit pattern) on the photo mask and calculated from a result of dimensional measurement at a plurality of sites on the unit drawing pattern. The unit drawing pattern normally exists in plural numbers on the photo mask and the $\Delta CD_{local}$ is usually calculated from a result of the dimensional measurement of the respective unit drawing pattern.

The second dimensional variation corresponds to a dimensional variation caused by the development of a resist and etching of the light shielding film (global CD error) and this is represented by $\Delta CD_{global}$. The $\Delta CD_{global}$ is calculated from a result of measurement at a plurality of measuring sites randomly selected from a whole surface on the photo mask.

The third dimensional variation corresponds to a dimensional variation caused by a positional variation between deflection areas arisen by a movement of a stage of an electron beam exposure equipment (butting CD error) and this is represented by $\Delta CD_{butting}$. The $\Delta CD_{butting}$ is calculated from a result of measurement at a plurality of areas of the pattern extending across a boundary between those reflection areas.

In the prior art, the dimensional variation is divided only into a dimensional variation caused by a butting CD error and a dimensional variation caused by other CD errors. Therefore, no distinction is made between the global CD error and the local CD error.

In the present embodiment, the first to third dimensional variations are found in dispersion form. The dispersions of these three dimensional variations are represented by $\sigma_{local}$, $\sigma_{global}$ and $\sigma_{butting}$, respectively. As a result of measurement and calculation, these are found to be $\sigma_{local}$=2.0 nm, $\sigma_{global}$=2.6 nm, and $\sigma_{butting}$=3.0 nm   (step S2).

The degree of influence ($MEF_{local}$) imparted by the first dimensional variation to an exposure latitude, degree of influence ($MEF_{global}$) imparted by the second dimensional variation to an exposure latitude and degree of influence ($MEF_{butting}$) imparted by the third dimensional variation to an exposure latitude are found by experiments or simulation (step S3). As a result, it has been found that $MEF_{local}$=0.25%/nm,   $MEF_{global}$=0.43%/nm and $MEF_{butting}$=0.12%/nm.

Then a deteriorated amount of an exposure latitude, $\Delta EL$, caused by the dimensional variation of the photo mask is estimated from the following relation with the use of $\sigma_{local}$, $\sigma_{global}$, $\sigma_{butting}$, $MEF_{local}$, $MEF_{global}$ and $MEF_{butting}$ (step S4).

$$\Delta EL^2 = (MEF_{local} \times \Delta CD_{local})^2 + (MEF_{global} \times \Delta CD_{global})^2 + (MEF_{butting} \times \Delta CD_{butting})^2$$

$$\Delta CD_X = \alpha \times \sigma_X \text{ (X=local, butting, global)}$$

Here, α is usually set to be about 3.

Then the large/small relation (magnitude relation) between $\Delta EL$ and $\Delta EL_{budget}$ is obtained by comparison (step S5). If, as a result, $\Delta EL < \Delta EL_{budget}$, a formed photo mask is decided as being good. If, on the other hand, $\Delta EL \geq \Delta EL_{budget}$, a formed photo mask is decided as being failure. If, for example, $\Delta EL$ is found at a=3, then $\Delta EL$=3.8%. In this case, it is smaller than $L_{budget}$=4.0% and a resultant product is decided as being good.

In the conventional method in which no distinction is made between the global CD error and the local CD error, if $\Delta EL$ is estimated, then a calculation result is equivalent to $MEF_{local}$=$MEF_{global}$=0.43 and hence $\Delta EL$=4.4%. This value is greater than $\Delta EL_{butting}$=4.0% and a resultant product will be decided as being failure. This means that, in this conventional method, a good product is decided as being failure.

According to the present embodiment, as those CD errors other than the butting CD error, a distinction is made between the global CD error and the local CD error and a good/failure product decision is made, taking into consideration a varying degree of influence over the exposure latitude at a time of transferring the pattern of photo mask to a wafer caused by these CD errors. By doing so, the manufacturing error specification of the photo mask can be avoided from excessively acting and, as a result, it is possible to improve a yield relating to the manufacturing of the photo mask.

Those photo masks thus decided as being good are used in the manufacturing process (photolithography process) of a semiconductor device. The manufacturing of the semiconductor device and the manufacturing and/or good/failure decision of the photo mask are made by the same maker (device maker) or a different maker (mask maker).

(Second Embodiment)

In this embodiment, the evaluation method of photo masks will be explained below and, according to the second method, a process (step S2) for finding the dispersion of a dimensional variation of the first embodiment can be simplified.

Figure 2:
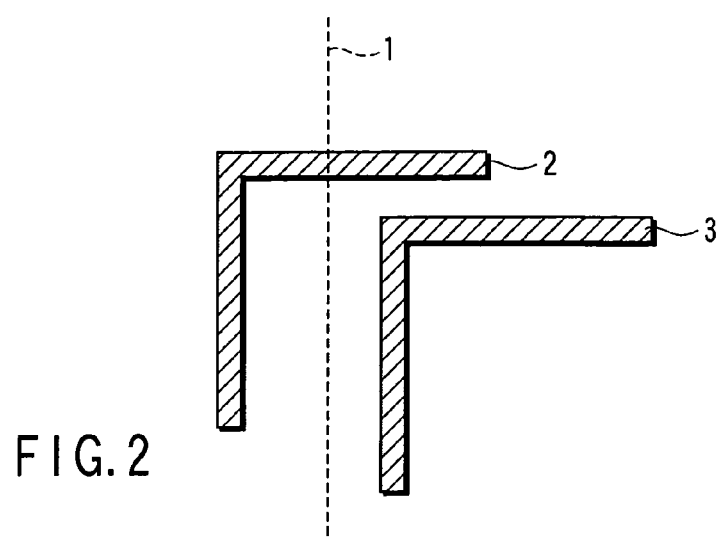
FIG. 2 is a plan view showing a pattern extending across a boundary between deflection zones and a pattern not extending across a boundary between the deflection zone.

FIG. 2 is a plan view showing a pattern 2 extending across a boundary 1 between deflection areas and a pattern 3 not extending across the deflection areas. In the second embodiment, the pattern 3 not extending across the boundary between the deflection variation is treated as a target for measuring the dimensional variation. This method can be done without paying no consideration of any dimensional variation $\Delta CD_{butting}$ caused by the butting CD error.

However, no separation is made between a dimensional variation $\Delta CD_{local}$ caused by a local CD error and a dimensional variation $\Delta CD_{global}$ caused by a global CD error. From the standpoint of improving a throughput for measurement, it would be done without measurement for finding the above-mentioned two dimensional variations $\Delta CD_{local}$ and $\Delta CD_{global}$ for each photo mask manufactured.

Here, the local CD error even under the same exposure equipment varies depending upon the state in which the equipment is used. Therefore, at a periodical checking of the exposure equipment, therefore, the dispersion of the dimensional variation caused by the local CD error is found and the dimensional variation $\sigma_{global}$ caused by the global CD error is found from the following relation.

$$\sigma_{global}^2 = \sigma_{measured}^2 - \sigma_{local}^2$$

In the above-mentioned relation, the $\sigma_{measured}$ represents a dispersion of the dimensional variation obtained at a dimensional measurement at many points on a practical photo mask to be evaluated while, on the other hand, $\sigma_{local}$ represents a dispersion (a dispersion of the dimensional variation caused by the local CD error of a checking photo mask) of the dimensional variation of the checking photo mask caused by a positional displacement and size mismatch of a unit drawing pattern in the checking photo mask at a periodical checking of the exposure equipment. Though an actual photo mask to be evaluated and checking photo mask generally differ, these provide no practical problem in finding the $\sigma_{local}$.

The $\sigma_{global}$ $(=(\sigma_{measured}^2 - \sigma_{local}^2)^{1/2})$ of the checking photo mask previously found in this way is used in place of a dispersion of the dimensional variation caused by the local CD error of a practical photo mask to be evaluated and $\Delta EL$ is found in the same way as that of the first embodiment.

According to the present embodiment, it is possible to more simply find a dispersion of the dimensional variation caused by the CD error than in the first embodiment and to realize the evaluation method of the photo mask.

By using the evaluation method of the photo mask of the present invention, the manufacturing error specification of the photo mask can be avoided from excessively acting and it is possible to improve a yield relating to the photo mask.

Further, those photo masks decided as being good can be used, in the same way as the first embodiment, in the manufacturing process of a semiconductor device (photolithography process).

(Third Embodiment)

In the present embodiment, a method of finding a degree of influence $MEF_{local}$ by a simulation will be explained below. The method of finding the degree of influence $MEF_{local}$ can be applicable to the first and second embodiments. Since a manner how to apply the method to the first and second embodiments is evident, a detailed explanation of the manner is omitted in the present embodiment.

First, a positional displacement and size of a unit drawing pattern are measured, and a dispersion resulting from a dimensional variation caused by the positional displacement and size mismatch of the unit drawing pattern (local CD error). $\sigma p_{represents}$ the dispersion caused by the positional displacement of the unit drawing picture and $\sigma w$ represents the dispersion caused by the size mismatch of the unit drawing pattern.

The degree of influence, $MEF_{local}$ depends upon the dispersions $\sigma p$ and $\sigma w$. The $MEF_{local}$ is found as a function of dispersions $\sigma p$, $\sigma w$ by a Monte Carlo simulation. The reason for the adoption of the Monte Carlo simulation is as follows.

That is, the local CD error has a property that even on the same pattern, a value of the local CD error varies by a fluctuation of its surrounding environment and the Monte Carlo simulation is liable to reflect the influence of the fluctuation of the environment around the pattern. In this connection it is to be noted that it is possible to find the degree of influence $MEF_{local}$, even under a simulation other than the Monte Carlo simulation.

Figure 3A:
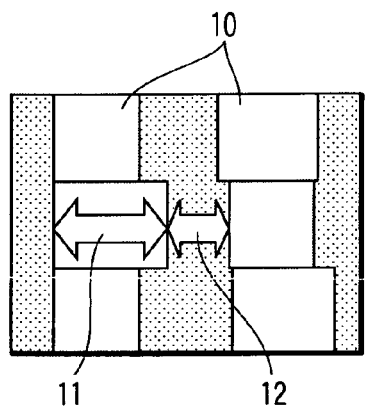
FIGS. 3A and 3B are views showing a line portion formed of a unit drawing pattern on a mask.
Figure 3B:
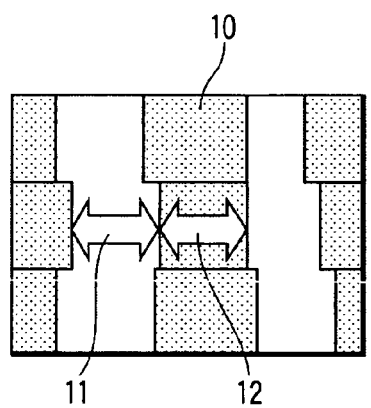

Under an assumption that a positive type is adopted for a resist for use in a mask pattern formation process, a line portion is formed between the unit drawing patterns as shown in FIG. 3A. Assuming that, on the other hand, a negative type resist is adopted, the unit drawing pattern itself is formed as shown in FIG. 3B. In FIGS. 3A and 3B, reference numeral 10 shows a unit drawing pattern, a reference numeral 11 shows a paste dimension ($Mn+\Delta M_n$) and reference numeral 12 shows a line dimension ($M+\Delta M$).

FIGS. 3A and 3B show one practical form in which the Monte Carlo simulation is made with respect to the position and size of the unit drawing pattern. From these Figures it is evident that there occurs a random variation in the position and size of the unit drawing pattern. That is, it is seen that there occur a positional displacement and size mismatch which are not originally found.

In the case of using the positive type resist as shown in FIG. 3A, the dispersion $\sigma M$ of the mask line dimension and dispersion $\sigma M_n$ of the mask space dimension $\sigma M_n$ are given by $$\sigma_M^2 = 2\sigma_p^2 + \frac{1}{2}\sigma_W^2, \quad \sigma_{Mn}^2 = \sigma_W^2$$

If, on the other hand, use is made of a negative type resist, the following equation is given by $$\sigma_M^2 = \sigma_M^2, \quad \sigma_{Mn}^2 = 2\sigma_p^2 + \frac{1}{2}\sigma_{W2}$$

An exposure amount necessary for the line portion to be finished to a desired dimension when a pattern is transferred to a wafer with the use of such a mask is represented as E (calling this a correct exposure amount). A variation $\Delta E$ of the correct exposure amount provides a function of a variation $\Delta M$ of a mask dimension of the line portion and variation $\Delta M_n$ of the mask dimension of an optimal adjacent space portion. If $\Delta M$ and $\Delta M_n$ are smaller, a total differential equation is given below.

$$\Delta E = \frac{\partial E}{\partial M}\Delta M + \frac{\partial E}{\partial M_n}\Delta M_n$$

Here, $\Delta M$ and $\Delta M_n$ are amounts randomly varied by the Monte Carlo simulation. A dispersion $\sigma E$ of $\Delta E$ is given by $$\sigma_E^2 = \left(\frac{\partial E}{\partial M}\right)^2 \sigma_M^2 + \left(\frac{\partial E}{\partial M_n}\right)^2 \sigma_{Mn}^2$$

The above equation, being represented by $\sigma p$, $\sigma w$, becomes $$\sigma_E^2 = 2\left(\frac{\partial E}{\partial M}\right)^2 \sigma_P^2 + \left\{\frac{1}{2}\left(\frac{\partial E}{\partial M}\right)^2 + \left(\frac{\partial E}{\partial M_n}\right)^2\right\}\sigma_W^2$$

for the case of the positive type resist.

For the case of the negative type resist, the following equation is given $$\sigma_E^2 = 2\left(\frac{\partial E}{\partial M_n}\right)^2 \sigma_P^2 + \left\{\left(\frac{\partial E}{\partial M}\right)^2 + \frac{1}{2}\left(\frac{\partial E}{\partial M_n}\right)^2\right\}\sigma_W^2$$

from the above, the degree of influence, $MEF_{local}$ is found with respect to the positive type resist, the following equation is obtained.

$$MEF_{local}^2 = \frac{\sigma_E^2}{\sigma_M^2} = \left(\frac{\partial E}{\partial M}\right)^2 + \left(\frac{\partial E}{\partial M_n}\right)^2 \frac{1}{2(\sigma_p/\sigma_w)^2 + 1/2}$$

For the case of the negative type resist, it is evident to obtain the following equation.

$$MEF_{local}^2 = \frac{\sigma_E^2}{\sigma_M^2} = \left(\frac{\partial E}{\partial M}\right)^2 + \left(\frac{\partial E}{\partial M_n}\right)^2 \left\{2\left(\frac{\sigma_p}{\sigma_w}\right)^2 + \frac{1}{2}\right\}$$

In the limit of an isolation pattern, the following equation is obtained.

$$\frac{\partial E}{\partial M_n} \to 0$$

and the degree of influence $MEF_{local}$ becomes constant without depending upon $\sigma p/\sigma w$. Irrespective of the positive and negative types, the degree of influence, $MEF_{local}$ is considered as be a function of $\sigma p/\sigma w$ including this constant value.

FIG. 4 shows the dispersion $\sigma M$ of the line dimension of the mask and the dispersion $\sigma E$ of the correct exposure amount obtained by the Monte Carlo simulation while varying $\sigma p$, $\sigma w$ in various values.

The exposure conditions are the exposure wave length $\lambda=248$ nm, numeral aperture NA=0.8, coherence $\sigma=0.75$, ring band shielding percentage $\epsilon=0.67$ and pattern=125 nm L/S line portion. The resist used in the mask pattern forming process is of a positive type. From a method of least squares method, the following values are obtained.

$$\left|\frac{\partial E}{\partial M}\right| = 0.094, \left|\frac{\partial E}{\partial M_n}\right| = 0.233$$

Figure 5:
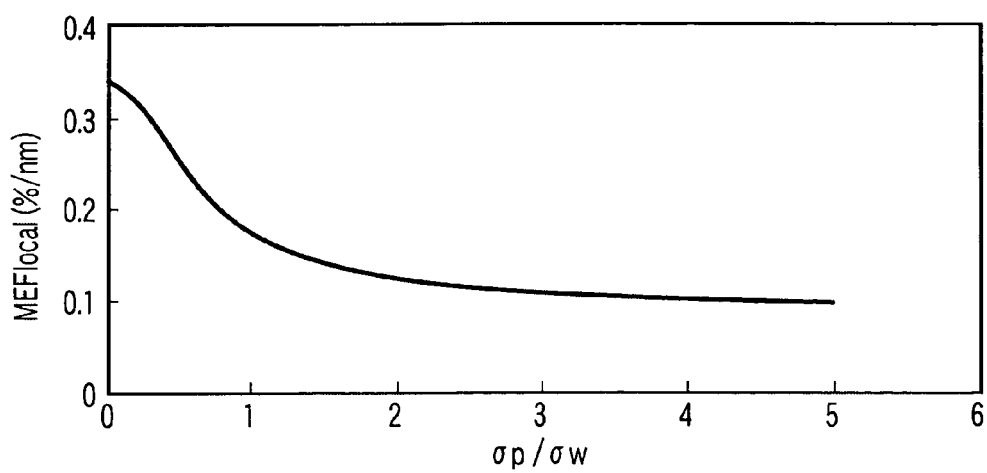
FIG. 5 is a view showing a result of finding a degree of influence, $MEF_{local}$, plotted as a function of σp/σw with the use of the Monte Carlo simulation.

FIG. 5 shows a group plotting the $MEF_{local}$ as a function of $\sigma p/\sigma w$. That is, from a plurality of dispersions given (measured) with respect to a mask to be manufactured, a plurality of $\sigma p/\sigma w$ ratios are calculated and, from these $\sigma p/\sigma w$ ratios, a relation of FIG. 5 is obtained between the $MEF_{local}$ and $\sigma p/\sigma w$ ratios found by the Monte Carlo simulation. With the use of the $MEF_{local}$ thus obtained, $\Delta EL$ is found in the same way as in the first embodiment.

The present invention is not limited to the above mentioned embodiments. For example, the deteriorated amount $\Delta EL$ of the exposure latitude has been explained as being found with the use of the square sum (step S4), it does not matter even if it is found by the use of a simple sum or, in the case where the probability distribution of the first to third dimensional variations is statistically found, the $\Delta EL$ can be found with the use of a convolution integration method.

Further, the above mentioned embodiments is explained in a case that the electron beam exposure equipment is used, but other type of exposure equipment can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for evaluating a photo mask comprising:
preparing a photo mask including a unit drawing pattern;
finding a dimensional variation relating to the photo mask, the dimensional variation including first and second dimensional variations, the first dimensional variation occurring due to a positional displacement and size mismatch of the unit drawing pattern in the photo mask and the second dimensional variation occurring due to etching and development relating to a manufacturing of the photo mask;
estimating a deteriorated amount of an exposure latitude occurring due to the dimensional variation of the photo mask using the dimensional variation and a degree of influence of the dimensional variation for the exposure latitude; and
judging quality of the photo mask by comparing the deteriorated amount of the exposure latitude and an allowable deteriorated amount of the exposure latitude.

2. A method for evaluating a photo mask according to claim 1,
wherein finding the dimensional variation relating to the photo mask includes finding a third dimensional variation of the photo mask caused by a positional variation between deflection areas, the positional variation between the deflection areas being arisen by movement of a stage of an exposure equipment: and
estimating the deteriorated amount of the exposure latitude is performed by using the first, second and third dimensional variations and a degree of influence of the dimensional variation relating to the photo mask for the exposure latitude.

3. A method for evaluating a photo mask according to claim 1,
wherein finding the dimensional variation relating to the photo mask includes measuring a pattern on the photo mask, the pattern not extending across a boundary between deflection areas, the deflection areas being arisen by movement of a stage of an exposure equipment.

4. A method for evaluating a photo mask according to claim 1,
wherein a dimensional variation of a checking photo mask is substituted for the first dimensional variation, the dimensional variation of the checking photo mask is previously obtained when an exposure equipment used for manufacturing the photo mask is checked with the checking photo mask, and the dimensional variation of the checking photo mask occurs due to a positional displacement and size mismatch of a unit drawing pattern in the checking photo mask.

5. A method for evaluating photo mask according to claim 2,
wherein a dimensional variation of a checking photo mask is substituted for the first dimensional variation, the dimensional variation of the checking photo mask is previously obtained when an exposure equipment used for manufacturing the photo mask is checked with the checking photo mask, and the dimensional variation of the checking photo mask occurs due to a positional displacement and size mismatch of a unit drawing pattern in the checking photo mask.

6. A method for evaluating photo mask according to claim 3,
wherein a dimensional variation of a checking photo mask is substituted for the first dimensional variation, the dimensional variation of the checking photo mask is previously obtained when an exposure equipment used for manufacturing the photo mask is checked with the checking photo mask, and the dimensional variation of the checking photo mask occurs due to a positional displacement and size mismatch of a unit drawing pattern in the checking photo mask.

7. A method for evaluating photo mask according to claim 1,
wherein the degree of influence of the first dimensional variation for the exposure latitude is estimated using a function with variables having the positional displacement of the unit drawing pattern and variation of the size mismatch of the unit drawing pattern.

8. A method for evaluating photo mask according to claim 2,
dimensional variation for the exposure latitude is estimated using a function with variables having the positional displacement of the unit drawing pattern and variation of the size mismatch of the unit drawing pattern.

9. A method for evaluating photo mask according to claim 3,
dimensional variation for the exposure latitude is estimated using a function with variables having the positional displacement of the unit drawing pattern and variation of the size mismatch of the unit drawing pattern.

10. A method for evaluating photo mask according to claim 7,
wherein the function is a function with a variable having a ratio of (the variation of the size mismatch of the unit drawing pattern)/(the variation of the positional displacement of the unit drawing pattern) as a variable.

11. A method for evaluating photo mask according to claim 8,
wherein the function is a function with a variable having a ratio of (the variation of the size mismatch of the unit drawing pattern)/(the variation of the positional displacement of the unit drawing pattern) as a variable.

12. A method for evaluating photo mask according to claim 9,
wherein the function is a function with a variable having a ratio of (the variation of the size mismatch of the unit drawing pattern)/(the variation of the positional displacement of the unit drawing pattern) as a variable.

13. A method for evaluating a photo mask according to claim 10,
wherein the function is found by a Monte Carlo simulation.

14. A method for evaluating a photo mask according to claim 11,
wherein the function is found by a Monte Carlo simulation.

15. A method for evaluating a photo mask according to claim 12,
wherein the function is found by a Monte Carlo simulation.

16. A method for manufacturing a semiconductor device comprising:
selecting a good photo mask by judging quality of a photo mask using a photo mask evaluating method, the photo mask evaluating method comprising preparing a photo mask including a unit drawing pattern; finding a dimensional variation relating to the photo mask, the dimensional variation including first and second dimensional variations, the first dimensional variation occurring due to a positional displacement and size mismatch of the unit drawing pattern in the photo mask and the second dimensional variation occurring due to etching and development relating to a manufacturing of the photo mask; estimating a deteriorated amount of an exposure latitude occurring due to the dimensional variation of the photo mask using the dimensional variation and a degree of influence of the dimensional variation for the exposure latitude; and judging quality of the photo mask by comparing the deteriorated amount of the exposure latitude and an allowable deteriorated amount of the exposure latitude, and
performing a photolithography process using the selected good photo mask.

17. A method for manufacturing a semiconductor device according to claim 16,
wherein finding the dimensional variation relating to the photo mask includes finding a third dimensional variation of the photo mask caused by a positional variation between deflection areas, the positional variation between deflection areas being arisen by movement of a stage of an exposure equipment: and
estimating the deteriorated amount of the exposure latitude is performed by using the first, second and third dimensional variations and a degree of influence of the dimensional variation relating to the photo mask for the exposure latitude.

18. A method for manufacturing a semiconductor device according to claim 16, wherein finding the dimensional variation relating to the photo mask includes measuring a pattern on the photo mask not extending across a boundary between deflection areas, the deflection areas being arisen by movement of a stage of an exposure equipment.

19. A method for manufacturing a semiconductor device according to claim 16, wherein a dimensional variation of a checking photo mask is substituted for the first dimensional variation, the dimensional variation of the checking photo mask is previously obtained when an exposure equipment used for manufacturing the photo mask is checked with the checking photo mask, and the dimensional variation of the checking photo mask occurs due to a positional displacement and size mismatch of a unit drawing pattern in the checking photo mask.

20. A method for manufacturing a semiconductor device according to claim 17, wherein a dimensional variation of a checking photo mask is substituted for the first dimensional variation, the dimensional variation of the checking photo mask is previously obtained when an exposure equipment used for manufacturing the photo mask is checked with the checking photo mask, and the dimensional variation of the checking photo mask occurs due to a positional displacement and size mismatch of a unit drawing pattern in the checking photo mask.

* * * * *

UNITED STATES PATENT AND TRADEMARK OFFICE
CERTIFICATE OF CORRECTION

PATENT NO. : 7,229,721 B2  Page 1 of 1
APPLICATION NO. : 10/705954
DATED : June 12, 2007
INVENTOR(S) : Mimotogi et al.

It is certified that error appears in the above-identified patent and that said Letters Patent is hereby corrected as shown below:

Claim 2, column 8, line 65, change "equipment: and" to --equipment; and--.

Claim 17, column 10, line 62, change "equipment: and" to --equipment; and--.

Signed and Sealed this

Seventh Day of August, 2007

JON W. DUDAS
*Director of the United States Patent and Trademark Office*